United States Patent
Du

(10) Patent No.: US 9,269,647 B2
(45) Date of Patent: Feb. 23, 2016

(54) SEMICONDUCTOR PACKAGE HAVING HEAT DISSIPATING MEMBER

(71) Applicant: Samsung Electronics Co., Ltd., Suwon-si, Gyeonggi-do (KR)

(72) Inventor: Maohua Du, Suzhou (CN)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/723,834

(22) Filed: May 28, 2015

(65) Prior Publication Data

US 2015/0348863 A1  Dec. 3, 2015

(30) Foreign Application Priority Data

May 29, 2014 (CN) .......................... 2014 1 0235180
Jan. 6, 2015 (KR) ........................ 10-2015-0001178

(51) Int. Cl.

| H01L 23/34 | (2006.01) |
|---|---|
| H01L 21/00 | (2006.01) |
| H01L 23/367 | (2006.01) |
| H01L 23/00 | (2006.01) |
| H01L 23/31 | (2006.01) |
| H01L 23/373 | (2006.01) |
| H01L 23/29 | (2006.01) |

(Continued)

(52) U.S. Cl.
CPC ............ *H01L 23/367* (2013.01); *H01L 21/563* (2013.01); *H01L 23/293* (2013.01); *H01L 23/295* (2013.01); *H01L 23/3135* (2013.01); *H01L 23/3737* (2013.01); *H01L 23/42* (2013.01); *H01L 23/564* (2013.01); *H01L 24/17* (2013.01); *H01L 25/0657* (2013.01); *H01L 21/561* (2013.01); *H01L 23/49816* (2013.01); *H01L 2224/16225* (2013.01); *H01L 2225/06589* (2013.01); *H01L 2924/0635* (2013.01); *H01L 2924/0665* (2013.01); *H01L 2924/07025* (2013.01); *H01L 2924/186* (2013.01); *H01L 2924/1815* (2013.01); *H01L 2924/2064* (2013.01); *H01L 2924/20641* (2013.01)

(58) Field of Classification Search
CPC ... H01L 23/367; H01L 23/42; H01L 23/3128; H01L 21/563; H01L 23/295; H01L 21/561; H01L 23/49816
See application file for complete search history.

(56) References Cited

U.S. PATENT DOCUMENTS

| 6,586,847 B1 * | 7/2003 | Langari et al. ................. 257/788 |
| 7,070,670 B2 * | 7/2006 | Tomiyama et al. ........... 156/248 |

(Continued)

FOREIGN PATENT DOCUMENTS

| JP | 2008171963 A | 7/2008 |
| JP | 2010510653 A | 4/2010 |

(Continued)

*Primary Examiner* — Alonzo Chambliss
(74) *Attorney, Agent, or Firm* — Harness, Dickey & Pierce, PLC

(57) ABSTRACT

A semiconductor package includes a substrate having an upper surface and a lower surface, a semiconductor chip which is mounted on the upper surface of the substrate, and in an upper surface of which a first recess portion is provided, a molding member formed such that the molding member exposes the upper surface of the semiconductor chip and covers the semiconductor chip on the upper surface of the substrate, and a first heat dissipating member formed in the first recess portion, wherein the first heat dissipating member includes moisture absorption particles and a heat dissipation molding member.

20 Claims, 19 Drawing Sheets

(51) Int. Cl.
    *H01L 25/065*     (2006.01)
    *H01L 23/42*     (2006.01)
    *H01L 21/56*     (2006.01)
    *H01L 23/498*     (2006.01)

(56) References Cited

U.S. PATENT DOCUMENTS

| | | | | |
|---|---|---|---|---|
| 7,244,662 | B2 * | 7/2007 | Kondo | 438/458 |
| 7,560,821 | B2 * | 7/2009 | Osuga et al. | 257/788 |
| 7,808,085 | B2 * | 10/2010 | Ozaki et al. | 257/667 |
| 7,969,027 | B2 * | 6/2011 | Osada | 257/789 |
| 8,299,595 | B2 * | 10/2012 | Yoon et al. | 257/686 |
| 8,563,438 | B2 * | 10/2013 | Maekawa | 438/720 |
| 2006/0254712 | A1 * | 11/2006 | Soliz et al. | 156/307.3 |
| 2007/0152314 | A1 * | 7/2007 | Manepalli et al. | 257/686 |

FOREIGN PATENT DOCUMENTS

| | | |
|---|---|---|
| KR | 10-0633889 B1 | 10/2006 |
| KR | 1020070088047 A | 8/2007 |
| KR | 1020080077837 A | 8/2008 |

* cited by examiner

SEMICONDUCTOR PACKAGE HAVING HEAT DISSIPATING MEMBER

CROSS-REFERENCE TO RELATED APPLICATION

This application claims the benefit of Korean Patent Application No. 10-2015-0001178, filed on Jan. 6, 2015, in the Korean Intellectual Property Office and Chinese Patent Application No. 201410235180.1, filed on May 29, 2014, in the Chinese Intellectual Property Office, the disclosures of which are incorporated herein in their entireties by reference.

BACKGROUND

The inventive concepts relate to a semiconductor package, and more particularly, to a semiconductor package dissipating heat via a heat dissipating member.

Recently, as semiconductor devices, such as mobile terminals, have become highly integrated and have come to perform multiple functions, power consumption of the semiconductor devices has increased. Thus, heat dissipation of the semiconductor devices has become more important. Meanwhile, in highly integrated semiconductor devices, spatial restrictions exist for heat dissipation. Accordingly, a semiconductor packaging technology which may efficiently dissipate heat and is suitable for use with a device with high integration is required.

SUMMARY

The inventive concepts provide a semiconductor package capable of effectively dissipating heat which may be accompanied when the semiconductor package operates, thereby securing operational stability.

According to an aspect of the inventive concepts, there is provided a semiconductor package that may include a substrate having an upper surface and a lower surface, a semiconductor chip mounted on the upper surface of the substrate, in the semiconductor chip including an upper surface, and the upper surface including a first recess portion, a molding member that exposes the upper surface of the semiconductor chip and may be disposed between the semiconductor chip and the upper surface of the substrate, and a first heat dissipating member formed in the first recess portion, wherein the first heat dissipating member includes at least one moisture absorption particle and a heat dissipation molding member.

In at least one example embodiment, the upper surface of the semiconductor chip may include a protrusion portion defined by the first recess portion, and the protrusion portion may have a matrix structure.

In at least one example embodiment, the first recess portion may have a depth that is equal to or less than 100 μm.

In at least one example embodiment, a second recess portion may be provided on an upper surface of the molding member, and a second heat dissipating member may be formed in the second recess portion.

In at least one example embodiment, the moisture absorption particles may absorb moisture around the semiconductor package at room temperature.

In at least one example embodiment, the moisture absorption particles may be formed from at least one of sodium polyacrylate, polyacrylic alcohol-based copolymer, polyacryl amide, potassium polyacrylate, polyacrylic acid, silica gel, molecular sieve, montmorillonite clay, and zeolite.

In at least one example embodiment, the heat dissipating molding member may be formed from an epoxy-group molding resin or a polyimide-group molding resin.

In at least one example embodiment, the semiconductor package may further include a bump interposed between the semiconductor chip and the substrate, and the semiconductor chip is mounted on the substrate by using the bump as a medium.

In at least one example embodiment, the substrate may have an opening slit formed in a central portion thereof, and the semiconductor chip may be mounted on the substrate in a face-down manner.

In at least one example embodiment, an upper surface of the heat dissipating member may be lower than the upper surface of the semiconductor chip.

In at least one example embodiment, an upper surface of the heat dissipating member may be located at the same height as the upper surface of the semiconductor chip.

In at least one example embodiment, an upper surface of the heat dissipating member may be higher than the upper surface of the semiconductor chip.

According to another aspect of the inventive concepts, there is provided a semiconductor package that may include a substrate having an upper surface and a lower surface, a semiconductor chip mounted on the upper surface of the substrate, a molding member that may expose an upper surface and a side surface of the semiconductor chip on the upper surface of the substrate, and the upper surface may include a recess portion, and a heat dissipating member formed in the recess portion, wherein the heat dissipating member may include a plurality of moisture absorption particles and a heat dissipation molding member.

In at least one example embodiment, a lower surface of the recess portion may be higher than the upper surface of the semiconductor chip.

According to another aspect of the inventive concepts, there is provided a semiconductor package that may include a substrate, at least one semiconductor device, a molding member, the molding member including at least one heat dissipating member, and the heat dissipating member including a plurality of moisture absorption particles and a heat dissipation molding member.

In at least one example embodiment, the semiconductor device may include at least one heat dissipating member disposed on an upper surface of the semiconductor device.

In at least one example embodiment, the at least one semiconductor device may include a plurality of semiconductor devices arranged in a stacked manner, and the molding member may cover the exposed surfaces of the plurality of semiconductor devices.

In at least one example embodiment, the moisture absorption particles may be formed from a moisture absorption substance.

In at least one example embodiment, the molding member may define the exposed surface of the semiconductor device.

BRIEF DESCRIPTION OF THE DRAWINGS

The foregoing and other features of inventive concepts will be apparent from the more particular description of non-limiting example embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 2 and 3 are enlarged views of areas corresponding to the area A of FIG. 1B;

FIG. 13 illustrates an example embodiment in which the electronic system of FIG. 12 is applied to the SSD device.

DETAILED DESCRIPTION

Figure 1A:
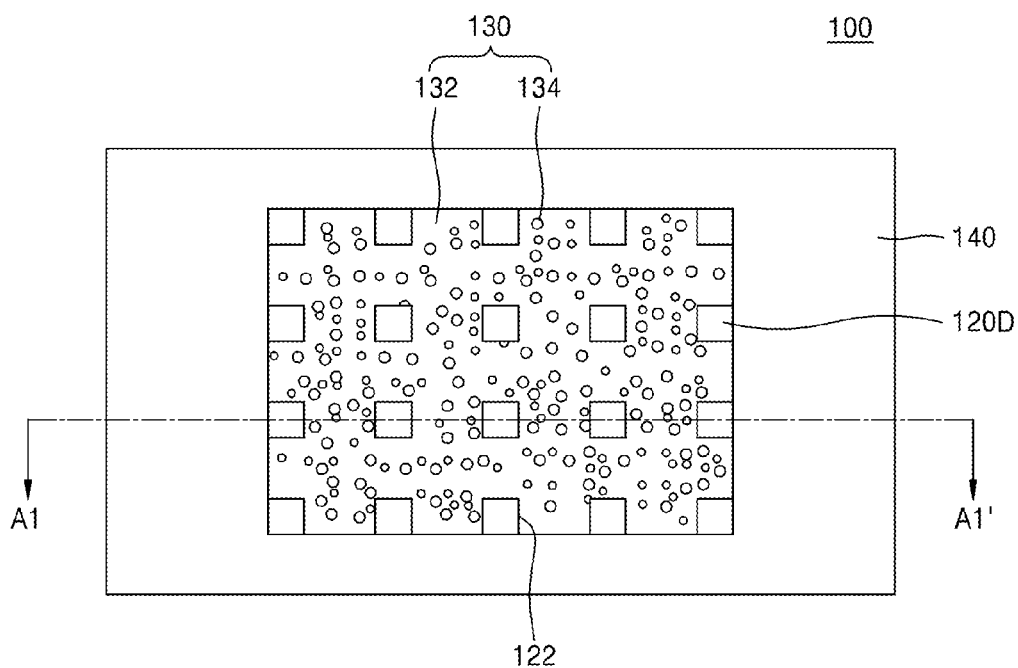
FIG. 1A is a plan view of a semiconductor package according to an example embodiment.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 1B:
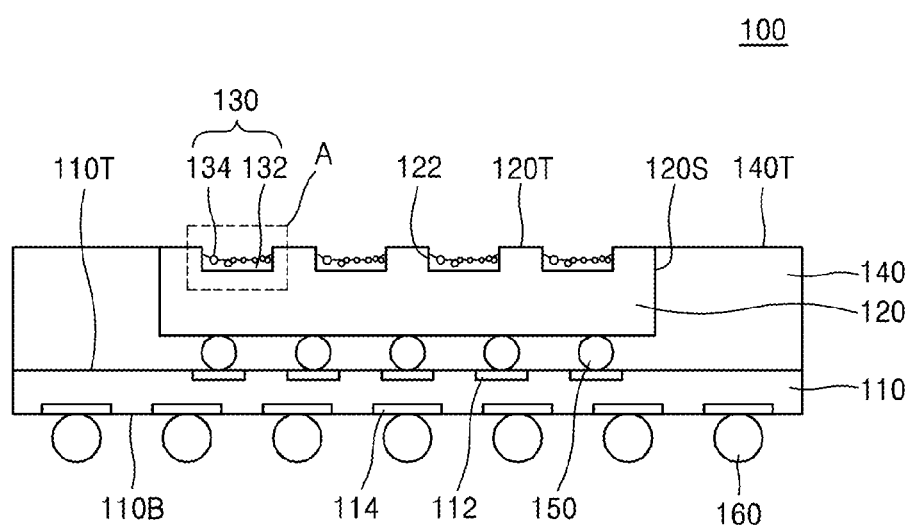
FIG. 1B is a cross-sectional view taken along a line A1-A1' of FIG. 1A according to an example embodiment.
Figure 1C:
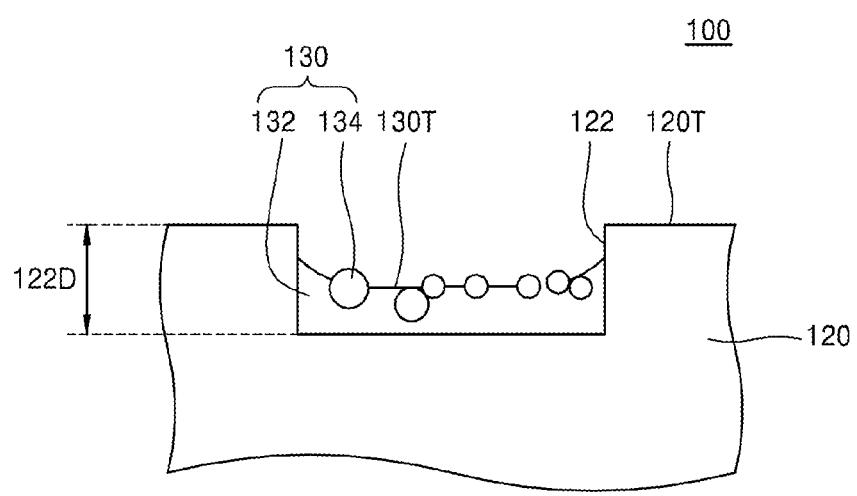
FIG. 1C is an enlarged view of an area A of FIG. 1B according to an example embodiment.

FIG. 1A is a plan view of a semiconductor package 100 according to an example embodiment. FIG. 1B is a cross-sectional view of a line A1-A1' of FIG. 1A. FIG. 1C is an enlarged view of an area A of FIG. 1B.

Referring to FIGS. 1A through 1C, the semiconductor package 100 may include a substrate 110, a semiconductor chip 120 mounted on an upper surface 110T of the substrate 110, a molding member 140 formed such that the molding member covers, surrounds, and/or is adjacent to the upper surface 110T of the substrate 110 and a side wall 120S of the semiconductor chip 120, a bump 150 connecting the substrate 110 and the semiconductor chip 120, a solder ball 160 coupled to a lower surface 110B of the substrate 110, and a heat dissipating member 130 formed in a recess portion 122 of the semiconductor chip 120.

The substrate 110 may be, for example, a printed circuit board (PCB). The PCB may be a single-sided PCB or a double-sided PCB. Also, the PCB may be a multi-layer PCB including one or more internal wiring patterns in the substrate. Furthermore, the substrate 110 may be a rigid PCB or a flexible PCB.

In some example embodiments, the substrate 110 may include, for example, an epoxy resin, a polyimide resin, a bismaleimide triazine (BT) resin, flame retardant 4 (FR-4), FR-5, ceramic, silicon, glass, photosensitive liquid dielectrics, photosensitive dry-film dielectrics, polyimide flexible film thermally cured dry films, thermally cured liquid dielectrics, resin-coated copper foil (RCC), thermoplastic, or a flexible resin.

In some example embodiments, the substrate 110 may be formed of a plurality of rigid flat substrates adhering to one another, or of a thin flexible PCB and a rigid flat substrate adhering to one another. The plurality of rigid flat substrates adhering to one another and the PCBs may each include wiring patterns. Also, the substrate 110 may include a low temperature co-fired ceramic (LTCC) substrate. The LTCC substrate may be formed of a plurality of ceramic layers that are stacked and the LTCC substrate may include wiring patterns.

Although not shown, the substrate 110 may include at least one insulating layer (not shown) and at least one metal wiring layer (not shown). The metal wiring layer may be a circuit pattern formed on the substrate 110 and may be formed of a metal or metal alloy, for example, Al or Cu. In some example embodiments, a surface of the metal wiring layer may be plated with Sb, Au, Ni, or Pb.

The substrate 110 may include a conductive pad 112 configured to pass through the bump 150 to connect the semiconductor chip 120 and the substrate 110, and a solder ball pad 114 in which a solder ball 160 for connecting the semiconductor package 100 with external circuits is located. The conductive pad 112 and the solder ball pad 114 may be formed of a metal or metal alloy, for example, Al or Cu. In some example embodiments, surfaces of the conductive pad 112 and the solder ball pad 114 may be plated with Sb, Au, Ni, or Pb.

The substrate 110 may further include a via contact (not shown) that penetrates the upper surface 110T and the lower surface 110B of the substrate 110 to connect the conductive pad 112 and the solder ball pad 114.

The semiconductor chip 120 may be mounted on the upper surface 110T of the substrate 110.

In some example embodiments, the semiconductor chip 120 may be a semiconductor chip which performs various functions, such as those of a memory chip, a logic unit, a microprocessor, an analog device, a digital signal processor, a system on chip (SoC), or the like. Also, the semiconductor chip 120 may be a multi-chip having a structure in which two or more semiconductor chips are stacked. For example, all of the two or more semiconductor chips may be memory devices of the same type, or they may be of differing types. For example, one or more semiconductor chips may be a memory device and the other semiconductor chip(s) may be a microcontroller device.

Figure 6:
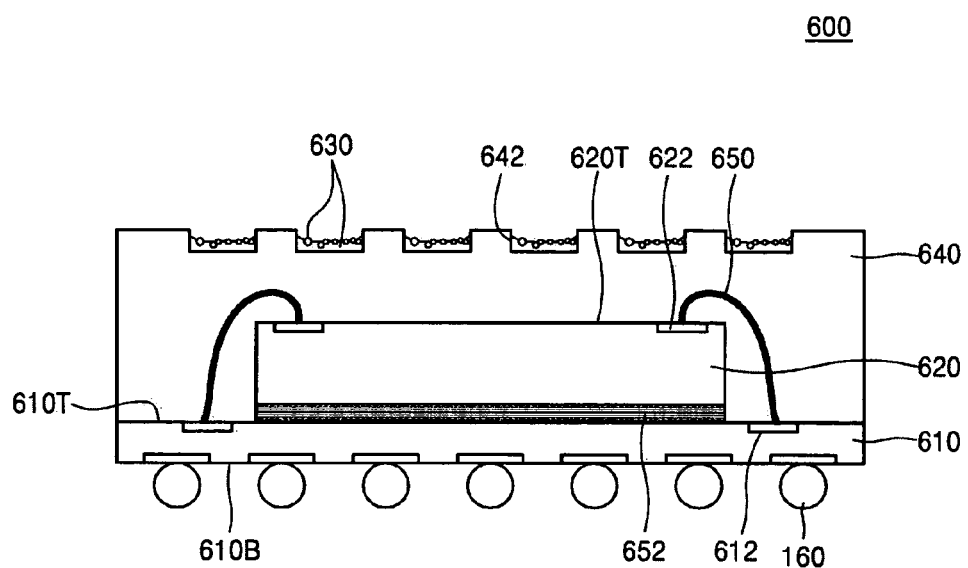
FIG. 6 is a cross-sectional view of a semiconductor package according to another example embodiment.

The semiconductor chip 120 illustrated in FIG. 1B is mounted on the substrate 110 by a flip-chip bonding method. However, the method in which the semiconductor chip 120 is mounted is not limited thereto. For example, as illustrated in FIG. 6, the semiconductor chip 120 may be mounted on the substrate 110 by a wire bonding method.

When the semiconductor chip 120 is mounted by the flip-chip bonding method, as illustrated in FIG. 1B, the semiconductor chip 120 may be connected with the substrate 110 via the bump 150.

Meanwhile, when the flip-chip bonding method is used, the molding member 140 may be formed by a molded underfill (MUF) process, or other like process. For example, the MUF process refers to a process in which a space between the semiconductor chip 120 and the substrate 110 is filled together with the molding member 140, without additionally performing a process of filling the space between the semiconductor chip 120 and the substrate 110 by using an underfill (not shown). When the molding member 140 is formed by the MUF process, a portion of the molding member 140 that covers (i.e., surrounds, is adjacent to, is layered upon, etc.) the outside of the semiconductor chip 120 and a portion of the molding member 140 that is between the semiconductor chip 120 and the substrate 110 are formed of the same material.

However, the molding member 140 may be formed without using the MUF process, unlike the illustration of FIG. 1B.

For example, the molding member 140 may be formed by first filling the space between the semiconductor chip 120 and the substrate 110 by using the underfill and then by covering the outside of the semiconductor chip 120 with an external molding member (not shown). Here, the underfill filling between the semiconductor chip 120 and the substrate 110 and the external molding member covering the outside of the semiconductor chip 120 may be formed of the same material or different materials.

Meanwhile, the semiconductor chip 120 may include the recess portion 122 formed in an upper surface 120T of the semiconductor chip 120. The recess portion 122 may be formed to have a depth 122D in which the heat dissipating member 130 that is to be described later may sufficiently absorb moisture outside the semiconductor package 100. For example, the recess portion 122 may be formed to have the depth 122D that is equal to or less than 100 μm. However, the depth 122D of the recess portion 122 is not limited thereto, and may vary according to a type and a size of the semiconductor package 100 or the semiconductor chip 120.

As illustrated in FIG. 1A, the upper surface 120T of the semiconductor chip 120 may include a protrusion portion 120D defined by the recess portion 122, and the protrusion portion 120D may have a matrix structure. However, the illustrated shape of the recess portion 122 is provided only as an example, and the recess portion 122, with respect to a plane view thereof, may have various pattern structures.

The heat dissipating member 130 may be formed in the recess portion 122.

In some example embodiments, an upper surface 130T of the heat dissipating member 130 may be lower than the upper surface 120T of the semiconductor chip 120, but is not limited thereto. For example, the heat dissipating member 130 may be formed to fill only a portion of the recess portion 122.

The heat dissipating member 130 may dissipate heat and/or transfer heat, which may be generated during an operation of the semiconductor package 100, to the outside of (i.e., away from) the semiconductor package 100.

In detail, the heat dissipating member 130 may include a heat dissipating molding member 132 and one or more moisture absorption particles 134.

The heat dissipating molding member 132 may fix the moisture absorption particles 134 in the heat dissipating member 130 by using its adhesive property. Also, the heat dissipating molding member 132 may distribute the heat of the semiconductor package 100.

The heat dissipating molding member 132 may include, for example, an epoxy-group molding resin or a polyimide-group molding resin. The epoxy-group molding resin may be, for example, a polycyclic aromatic epoxy resin, a bisphenol-group epoxy resin, a naphthalene-group epoxy resin, an o-cresol novolac epoxy resin, a dicyeclopentadiene epoxy resin, a biphenyl-group epoxy resin, a phenol novolac epoxy resin, or the like.

The heat dissipating molding member 132 is not limited to the above-described molding resins and may include various materials which may perform the function of fixing the moisture absorption particles 134 in the heat dissipating member 130 and distributing the heat of the semiconductor package 100.

In some example embodiments, the heat dissipating molding member 132 may be cured by heat, or otherwise processed, such that it may maintain its shape without being affected by the heat accompanied in the operation of the semiconductor package 100.

The moisture absorption particles 134 may dissipate heat of the semiconductor package 100 to the outside by absorbing moisture around the semiconductor package 100 and evaporating the absorbed moisture.

For example, the moisture absorption particles 134 may absorb the moisture around the semiconductor package 100 when the semiconductor package 100 is in a stand-by mode, that is, when the semiconductor package 100 is at or below a desired temperature, such as room temperature, before operating. Next, when the semiconductor package 100 is in an operation mode, the moisture absorbed by the moisture absorption particles 134 may be evaporated by the heat generated by the operation of the semiconductor package 100. During the evaporation, a portion of the heat generated by the semiconductor package 100 is used as the heat for vaporization. Accordingly, a portion of the heat accompanied in the operation of the semiconductor package 100 may be removed. In other words, the heat generated by the operation of the semiconductor package may be transferred away from the semiconductor package through the evaporation of moisture, water, liquid, etc. absorbed by the moisture absorption particles 134.

Meanwhile, the moisture absorption and evaporation of the moisture absorption particles 134 are not limited thereto, and may be performed within various temperature ranges according to materials of the moisture absorption particles 134.

For example, the moisture absorption of the moisture absorption particles 134 may be performed not only when the semiconductor package 100 is at room temperature before operating, but also when the semiconductor package 100 operates at a temperature that is equal to or less than a desired (or, alternatively predetermined) temperature (for example, 100° C.) In this case, the absorbed moisture may be evaporated when the semiconductor package 100 operates at a temperature that is equal to or higher than the desired and/or predetermined temperature.

The moisture absorption particles 134 may be formed of various materials having a high moisture absorption property, i.e., a moisture absorption substance. For example, the moisture absorption particles 134 may be formed of at least one material selected from sodium polyacrylate, a polyacrylic alcohol-based copolymer, polyacryl amide, potassium polyacrylate, polyacrylic acid, silica gel, molecular sieve, montmorillonite clay, and zeolite.

The molding member 140 may seal the semiconductor chip 120 on the upper surface 110T of the substrate 110 to protect the semiconductor chip 120 from dangerous elements in an external environment.

Figure 5:
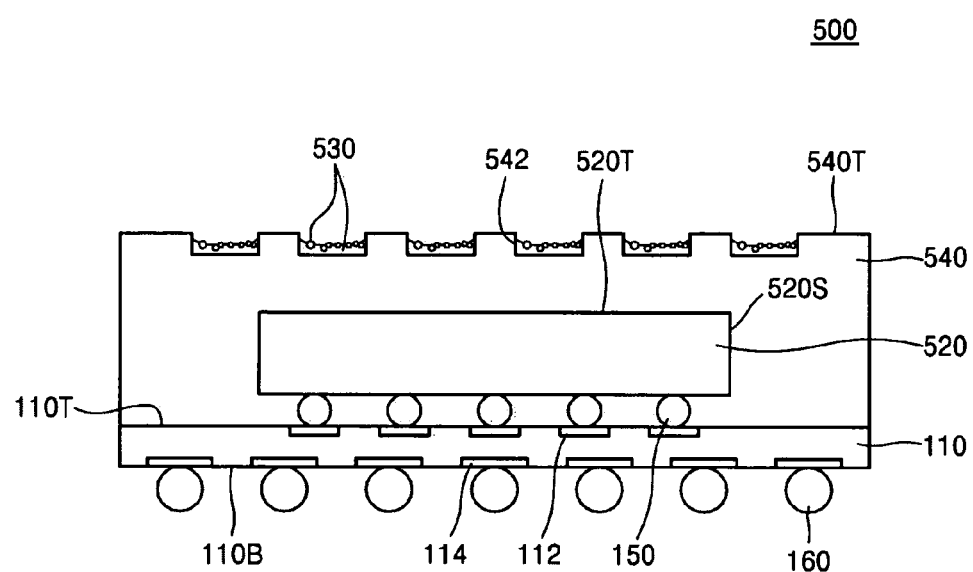
FIG. 5 is a cross-sectional view of a semiconductor package according to another example embodiment.

In some example embodiments, an upper surface 140T of the molding member 140 may be located at the same height as the upper surface 120T of the semiconductor chip 120. That is, although the molding member 140 according to the example embodiment is formed to cover only the side wall 120S of the semiconductor chip 120 and to expose the upper surface 120T of the semiconductor chip 120, it is not limited thereto. For example, as illustrated in FIG. 5, a molding member 540 may be formed to cover both an upper surface 520T and a side wall 520S of a semiconductor chip 520.

The molding member 140 may include an epoxy-group molding resin or a polyimide-group molding resin. The molding member 140 may be formed of the same material as the heat dissipating molding member 132. However, it is not limited thereto and the molding member 140 and the heat dissipating molding member 132 may be formed of different materials.

In some example embodiments, the molding resin may contain carbon black as a coloring agent. The molding resin may further contain a hardener, a hardening accelerator, a filler, a flame retardant, etc., in addition to the carbon black which is the coloring agent.

Examples of the hardener may include amine, a polycyclic aromatic phenol resin, a phenol novolac resin, a cresol novolac resin, a dicyeclopentadiene phenol resin, a xyloc-group resin, a naphthalene-group resin, etc.

The hardening accelerator may be a catalyst for accelerating a hardening reaction of the epoxy-group molding resin and the hardener. Examples of the hardening accelerator may include tertiary amines, such as benzyl dimethylamine, triethanolamine, triethylenediamine, dimethylaminoethanol, and tri(dimethylaminomethyl)phenol, imidazoles, such as 2-methylimidazole and 2-phenylimidazole, organic phosphines, such as triphenyl phosphine, diphenyl phosphine, and phenyl phosphine, and tetraphenyl boron salt, such as tetraphenylphosphonium tetraphenylborate and triphenylphosphine tetraphenylborate.

In some example embodiments, the filler may include a silica filler and the flame retardant may include a bromide epoxy resin, oxide of antimony, and a metal hydrate.

In addition, the molding resin may further contain a releasing agent, such as a higher fatty acid, a higher fatty acid metal salt, and an ester-based wax, and a stress relaxation agent, such as denaturalized silicon oil, silicon powder, and a silicon resin, as desired and/or as necessary.

The molding resin may have a viscosity appropriate for a molding condition. For example, the molding resin may be a fluidal solid, such as gel.

According to some example embodiments, the semiconductor package 100 includes the heat dissipating member 130, and thus, sufficient heat dissipation may be performed without increasing a volume of the semiconductor package 100.

Figure 2:
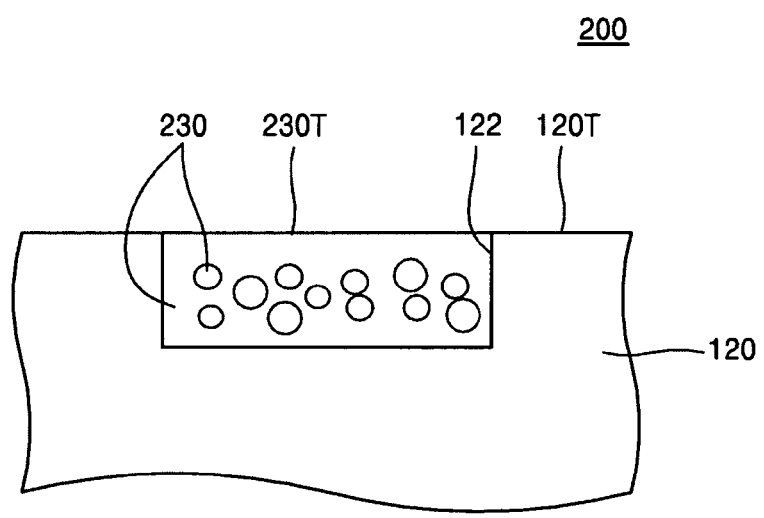
FIGS. 2 and 3 illustrate semiconductor packages according to other example embodiments.
Figure 3:
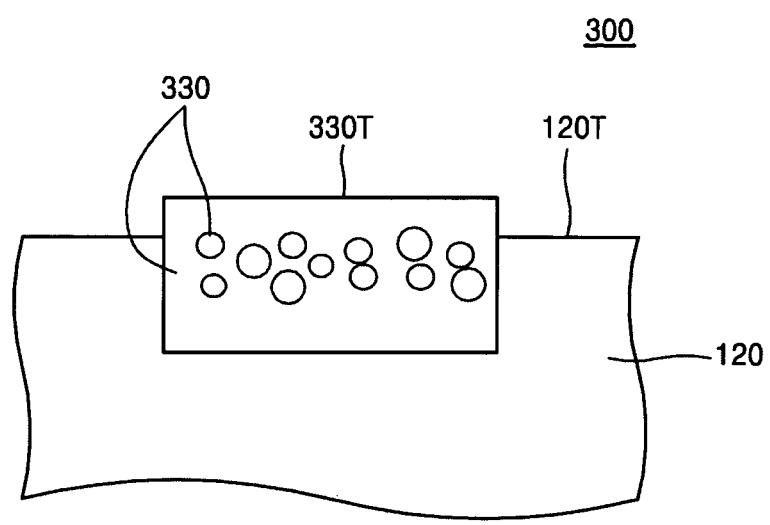

FIGS. 2 and 3 illustrate semiconductor packages 200 and 300 according to other example embodiments. FIGS. 2 and 3 are enlarged views of areas corresponding to area A of FIG. 1B.

Each of the semiconductor packages 200 and 300 of FIGS. 2 and 3 may have a structure similar to that of the semiconductor package 100 described with reference to FIGS. 1A through 1C, except the structures of heat dissipating members 230 and 330. Here, only the different aspects of the heat dissipating members 230 and 330 will be briefly described.

Referring to FIG. 2, the heat dissipating member 230 is formed in the recess portion 122 formed in the upper surface 120T of the semiconductor chip 120. An upper surface 230T of the heat dissipating member 230 may be located at the same height as the upper surface 120T of the semiconductor chip 120. That is, the heat dissipating member 230 may be formed to completely fill the recess portion 122.

According to some example embodiments, since the heat dissipating member 230 completely fills the recess portion 122, a maximum amount of moisture absorption of the heat dissipating member 230 is increased which makes it possible to efficiently use a space occupied by the semiconductor package 200.

Referring to FIG. 3, the heat dissipating member 330 is formed in the recess portion 122 formed in the upper surface 120T of the semiconductor chip 120. An upper surface 330T of the heat dissipating member 330 may be higher than the upper surface 120T of the semiconductor chip 120. That is, the heat dissipating member 330 may be formed to exceed the recess portion 122.

According to some example embodiments, a maximum amount of moisture absorption of the heat dissipating member 330 may be increased, which makes it possible to increase a surface area of the heat dissipating member 330 for more efficient moisture absorption and evaporation.

Figure 4:
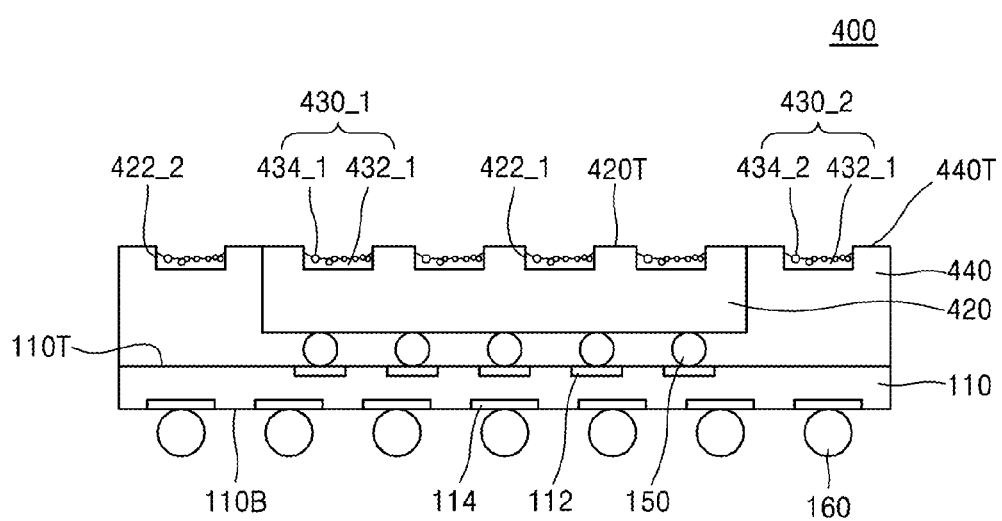
FIG. 4 is a cross-sectional view of a semiconductor package according to another example embodiment.

FIG. 4 is a cross-sectional view of a semiconductor package 400 according to another example embodiment. In FIG. 4, like reference numerals refer to like elements in FIGS. 1A through 3, and thus, repeated descriptions will be omitted for brevity of explanation.

Referring to FIG. 4, the semiconductor package 400 may include the substrate 110, a semiconductor chip 420 mounted on the upper surface 110T of the substrate 110, a molding member 440 formed to cover the upper surface 110T of the substrate 110 and a side wall of the semiconductor chip 420, the bump 150 connecting the substrate 110 and the semiconductor chip 420, the solder ball 160 coupled to the lower surface 110B of the substrate 110, a first heat dissipating member 430_1 formed in a first recess portion 422_1 of the semiconductor chip 420, and a second heat dissipating member 430_2 formed in a second recess portion 422_2 of the molding member 440.

The semiconductor package 400 according to the example embodiment has substantially the same structure as the semiconductor package 100 described with reference to FIG. 1B. However, the semiconductor package 400 differs from the semiconductor package 100 in that the heat dissipating member 430_2 may be formed not only on an upper surface 420T of the semiconductor chip 420, but also on an upper surface 440T of the molding member 440.

In other words, the semiconductor package 400 may include the first heat dissipating member 430_1 formed in the first recess portion 422_1 of the semiconductor chip 420 and the second heat dissipating member 430_2 formed in the second recess portion 422_2 of the molding member 440.

Meanwhile, unlike the semiconductor package 100 of FIG. 1B and the semiconductor package 400 of FIG. 4, a semiconductor package (not shown) may include a heat dissipating member only on the upper surface of the molding member and not on the upper surface of the semiconductor chip.

The semiconductor chip 420 and the molding member 440 may have substantially the same structure as the semiconductor chip 120 and the molding member 140 described with reference to FIG. 1B, respectively, and thus, their descriptions will be omitted.

The first heat dissipating member 430_1 may include a first heat dissipating molding member 432_1 and first moisture absorption particles 434_1. The first heat dissipating molding member 432_1 and the first moisture absorption particles 434_1 may respectively have substantially the same structure and material as the heat dissipating molding member 132 and the moisture absorption particles 134 described with reference to FIG. 1B, respectively.

The second heat dissipating member 430_2 may be formed in the second recess portion 422_2 formed in the upper surface 440T of the molding member 440.

In some example embodiments, a second heat dissipating molding member 432_2 and second moisture absorption particles 434_1 of the second heat dissipating member 430_2 may be formed of the same material as the first heat dissipating molding member 432_1 and the first moisture absorption particles 434_1, respectively. However, it is not limited thereto.

According to some example embodiments, when the heat dissipating member 430_2 is formed not only on the upper surface 420T of the semiconductor chip 420, but also on the upper surface 440T of the molding member 440, better heat dissipating function may be achieved because the maximum amount of moisture absorption of the heat dissipating member 230 is increased without an increase in the volume of the semiconductor package 100.

FIG. 5 is a cross-sectional view of a semiconductor package 500 according to another example embodiment. In FIG. 5, like reference numerals refer to like elements in FIGS. 1A through 4, and thus, repeated descriptions will be omitted for brevity of explanation.

Referring to FIG. 5, the semiconductor package 500 may include the substrate 110, a semiconductor chip 520 mounted on the upper surface 110T of the substrate 110, a molding member 540 formed to cover the upper surface 110T of the substrate and an upper surface 520T and a side wall 520S of the semiconductor chip 520, the bump 150 connecting the substrate 110 and the semiconductor chip 520, the solder ball 160 coupled to the lower surface 110B of the substrate 110, and a heat dissipating member 530 formed in a recess portion 542 of the molding member 540.

The semiconductor package 500 according to the example embodiment has substantially the same structure as the semiconductor package 100 described with reference to FIG. 1B. However, the semiconductor package 500 differs from the semiconductor package 100 in that the molding member 540 covers not only the side wall 520S of the semiconductor chip 520 but also the upper surface 520T of the semiconductor chip 520.

Accordingly, the heat dissipating member 530 may be formed on an upper surface 540T of the molding member 540.

The semiconductor chip 520, the heat dissipating member 530, and the molding member 540 may have substantially the same structure as the semiconductor chip 120, the heat dissipating member 130, and the molding member 140 described with reference to FIG. 1B, respectively, and thus, their descriptions will be omitted.

FIG. 6 is a cross-sectional view of a semiconductor package 600 according to another example embodiment. In FIG. 6, like reference numerals refer to like elements in FIGS. 1A through 5, and thus, repeated descriptions will be omitted for brevity of explanation.

Referring to FIG. 6, the semiconductor package 600 may include a substrate 610, a semiconductor chip 620 mounted on an upper surface 610T of the substrate 610, a molding member 640 formed to cover the upper surface 610T of the substrate 610 and an upper surface and a side wall of the semiconductor chip 620, a bonding wire 650 connecting the substrate 610 and the semiconductor chip 620, the solder ball 160 coupled to a lower surface 610B of the substrate 610, and a heat dissipating member 630 formed in a recess portion 642 of the molding member 640.

The semiconductor package 600 according to the example embodiment has substantially the same structure as the semiconductor package 500 described with reference to FIG. 5. However, the semiconductor package 600 differs from the semiconductor package 500 in that the semiconductor chip 620 is mounted by wire bonding.

The substrate 610, the semiconductor chip 620, the heat dissipating member 630, and the molding member 640 may have substantially the same structure as the substrate 110, the semiconductor chip 520, the heat dissipating member 530, and the molding member 540 described with reference to FIGS. 1B and 5, respectively, except the above-described difference, and thus, their descriptions will be omitted.

When the semiconductor chip 620 is mounted by wire bonding, as in the example embodiment, the semiconductor chip 620 may be coupled to the upper surface 610T of the substrate 610 by using an adhesive tape 652, and the semiconductor chip 620 and the substrate 610 may be electrically connected to each other via the bonding wire 650. For example, an end of the bonding wire 650 may be connected to a conductive pad 612 formed on the upper surface 610T of the substrate 610 and the other end of the bonding wire 650 may be connected to a chip conductive pad 622 formed on the upper surface 620T of the semiconductor chip 620, in order to electrically connect the semiconductor chip 620 and the substrate 610.

In some example embodiments, the bonding wire 650 may be formed of Au or Al wires, and the bonding wire 650 may have a shape of ball-bonding, wedge bonding, etc.

In some example embodiments, the bonding wire 650 may be connected by using any of a thermo compression connecting method and an ultrasonic connecting method. Also, the bonding wire 650 may be connected by using a thermo sonic connecting method combining the thermo compression connecting method and the ultrasonic connecting method.

Figure 7:
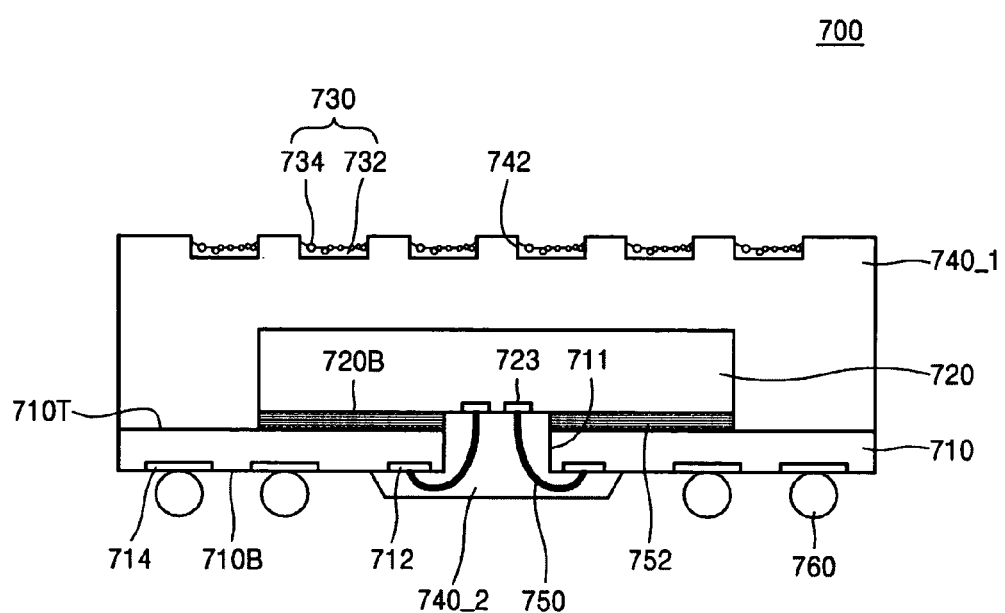
FIG. 7 is a cross-sectional view of a semiconductor package according to another example embodiment.

FIG. 7 is a cross-sectional view of a semiconductor package 700 according to another example embodiment. In FIG. 7, like reference numerals refer to like elements in FIGS. 1A through 6, and thus, repeated descriptions will be omitted for brevity of explanation.

Referring to FIG. 7, the semiconductor package 700 may include a substrate 710, a semiconductor chip 720 mounted on an upper surface 710T of the substrate 710, a first molding member 740_1 formed to cover the upper surface 710T of the substrate 710 and the semiconductor chip 720, a second molding member 740_2 formed to cover a portion of a lower surface 710B of the substrate 710 and a portion of a lower surface 720B of the semiconductor chip 720, an adhesive layer 752 coupling the semiconductor chip 720 to the upper surface 710T of the substrate 710, a bonding wire 750 connecting the substrate 710 and the semiconductor chip 720, a solder ball 760 coupled to a lower surface 710B of the substrate 710, and a heat dissipating member 730 formed in a recess portion 742 of the first molding member 740_1.

The semiconductor package 700 according to the example embodiment has substantially the same structure as the semiconductor package 600 described with reference to FIG. 6. However, the semiconductor package 700 differs from the semiconductor package 600 in a structure in which the substrate 710 and the semiconductor chip 720 are mounted.

The substrate 710 may include an opening slit 711 formed in a central portion of the substrate 710, a plurality of solder ball pads 714 and a plurality of conductive pads 712 formed on the lower surface 710B of the substrate 710.

Also, the substrate 710 may include at least one insulating layer (not shown) and at least one metal wiring layer (not shown). The substrate 710 may further include a protective layer (not shown) exposing only the solder ball pads 714 and the conductive pads 712 and covering all other areas. The protective layer may be formed as an SMD type that partially exposes the solder ball pads 714 and the conductive pads 712, or as an NSMD type that completely exposes the solder ball pads 714 and the conductive pads 712.

The opening slit 711 may be formed to penetrate the upper surface 710T and the lower surface 710B of the substrate 710 and may enable the semiconductor chip 720 to be mounted as a face down type.

The semiconductor chip 720 is mounted on the upper surface 710T of the substrate 710. The semiconductor chip 720 may be a semiconductor chip which performs various functions, such as those of a memory chip, a logic unit, a microprocessor, an analog device, a digital signal processor, an SoC, etc., similarly as the semiconductor chip 120 described with reference to FIG. 1B. The semiconductor chip 720 may be a multi-chip having a structure in which two or more semiconductor chips are stacked.

The semiconductor chip 720 may be mounted as the face down type as illustrated in FIG. 7. In detail, a chip conductive pad 723 of the semiconductor chip 720 may be disposed in a central portion, or other portion, of the lower surface 720B of the semiconductor chip 720, and may be electrically connected to the conductive pad 712 via the bonding wire 750 extending through the opening slit 711 formed in the substrate 710.

The heat dissipating member 730 may dissipate heat which may be generated during the operation of the semiconductor package 700 to the outside of the semiconductor package 700.

The heat dissipating member 730 may include a heat dissipating molding member 732 and one or more moisture absorption particles 734. The heat dissipating molding member 732 and the moisture absorption particles 734 may have substantially the same structure as the heat dissipating molding member 132 and the moisture absorption particles 134 described with reference to FIG. 1B, respectively, and thus, their descriptions will be omitted.

The first molding member 740_1 may be formed to cover the upper surface 710T of the substrate 710 and the semiconductor chip 720.

The second molding member 740_2 may be formed to cover a portion of the lower surface 710B of the substrate 710, a portion of the lower surface 720B of the semiconductor chip 720, and the bonding wire 750, in order to protecting the bonding wire 750 from dangerous elements in an external environment.

The first molding member 740_1 and the second molding member 740_2 may be formed of substantially the same material as the molding member 140 described with reference to FIG. 1B.

The first molding member 740_1 and the second molding member 740_2 may be formed of the same material by performing one process. However, it is not limited thereto. The first molding member 740_1 and the second molding member 740_2 may be formed of different materials by performing different processes.

Figure 8:
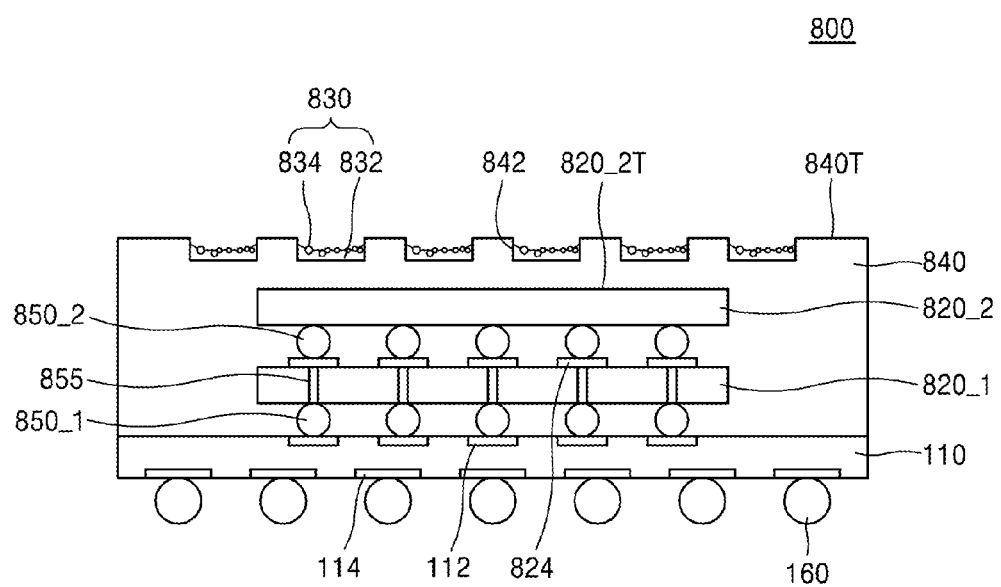
FIG. 8 is a cross-sectional view of a semiconductor package according to another example embodiment.

FIG. 8 is a cross-sectional view of a semiconductor package 800 according to another example embodiment. In FIG. 8, like reference numerals refer to like elements in FIGS. 1A through 6, and thus, repeated descriptions will be omitted for brevity of explanation.

Referring to FIG. 8, the semiconductor package 800 may include the substrate 110, an internal substrate 820_1 formed on the upper surface 110T of the substrate, a semiconductor chip 820_2 formed on an upper surface of the internal substrate 820_1, a molding member 840 formed to cover the upper substrate 110T of the substrate 110, the internal substrate 820_1, and the semiconductor chip 820_2, the solder ball 160 coupled to the lower surface 110B of the substrate 110, and a heat dissipating member 830 formed in a recess portion 842 of the molding member 840.

The semiconductor package 800 according to the example embodiment has substantially the same structure as the semiconductor package 500 described with reference to FIG. 5. However, the semiconductor package 800 differs from the semiconductor package 500 in that the semiconductor package 800 includes the internal substrate 820_1 formed between the substrate 110 and the semiconductor chip 820_2.

The internal substrate 820_1 may include an upper pad 824, a through silicon via (TSV) 855, and a first bump 850_1. Although not shown, the internal substrate 820_1 may further include a lower pad (not shown) that is formed of a conductive material on a lower surface of the internal substrate 820_1 and electrically connects the TSV 855 and the first bump 850_1.

The internal substrate 820_1 may be formed as a substrate based on an active wafer or as an interposer substrate. Here, the active wafer refers to a wafer in which a semiconductor chip may be formed, such as a silicon wafer.

When the internal substrate 820_1 is formed based on the active wafer, the internal substrate 820_1 may include a semiconductor substrate (not shown), an integrated circuit layer (not shown), an interlayer insulating layer (not shown), and an intermetallic insulating layer (not shown). Multiple wiring layers (not shown) may be formed in the intermetallic insulating layer. For example, the semiconductor substrate may include a group IV material wafer, such as a silicon wafer, or a group III-V compounds wafer. Also, the semiconductor substrate may be formed of a single crystal wafer, such as a silicon single crystal wafer. However, the semiconductor substrate is not limited to a single crystal wafer, and may be formed of various wafers, such as an epitaxial wafer, a polished wafer, an annealed wafer, a silicon on insulator (SOI) wafer, etc. For example, the epitaxial wafer may refer to a wafer formed by growing a crystal material on a single crystal silicon substrate.

When the internal substrate 820_1 is formed based on the active wafer, the internal substrate 820_1 may function as a memory device, a logic device, or any other semiconductor device. The memory device may include, for example, DRAM, SRAM, a flash memory, EEPROM, PRAM, MRAM, RRAM, etc.

Meanwhile, even if the internal substrate 820_1 is formed based on the active wafer, the internal substrate 820_1 may include only the semiconductor substrate and may not include the integrated circuit layer, the interlayer insulating layer, and the intermetallic insulating layer.

When the internal substrate 820_1 is formed as the interposer substrate, the internal substrate 820_1 may be formed of, for example, silicon, glass, ceramic, plastic, etc.

The upper pad 824 may be formed of a conductive material on the upper surface of the internal substrate 820_1 so as to be electrically connected to the TSV 855. Although it is illustrated in FIG. 8 that the upper pad 824 is directly connected to the TSV 855, the upper pad 824 may be connected to the TSV 855 via a wiring layer (not shown) in the internal substrate 820_1. The upper pad 824 may be formed of, for example, Al or Cu, by various plating techniques, such as pulse plating or direct current plating.

The TSV 855 may penetrate the internal substrate 820_1 to connect the substrate 110 and the semiconductor chip 820_2.

The TSV 855 may include at least one metal. For example, the TSV 855 may include a barrier metal layer (not shown) and a wiring metal layer (not shown). The barrier metal layer may include a stack of one or more selected from Ti, Ta, TiN, and TaN. The wiring metal layer may include one or more selected from Al, Au, Be, Bi, Co, Cu, Hf, In, Mn, Mo, Ni, Pb, Pd, Pt, Rh, Re, Ru, Ta, Te, Ti, W, Zn, and Zr. For example, the wiring metal layer may include a stack of one or more selected from W, Al, and Cu. However, materials of the TSV 855 are not limited thereto.

In some example embodiments, the TSV 855 may be formed as any of a via-first structure, a via-middle structure, and a via-last structure. For reference, the TSV may be divided into the via-first, the via-middle, and the via-last structures. The via-first structure refers to a structure in which the TSV is formed before an integrated circuit layer is formed. The via-middle structure refers to a structure in which the TSV is formed before multiple wiring layers are formed after the integrated circuit layer is formed. The via-last structure refers to a structure in which the TSV is formed after the multiple wiring layers are formed.

The first bump 850_1 may electrically connect the TSV 855 of the internal substrate 820_1 and the upper pad 112 of the substrate 110. The first bump 850_1 may be formed of a conductive material, such as Cu, Al, Ag, Tin, Au, and solder. However, materials of the first bump 850_1 are not limited thereto.

The semiconductor chip 820_2 may be connected to the internal substrate 820_1 via a second bump 850_2.

According to some example embodiments, only one semiconductor chip 820_2 is stacked on the internal substrate 820_1. However, it is not limited thereto. A plurality of semiconductor chips may be stacked on the internal substrate 820_1 in a similar, or different, manner as how semiconductor chip 820_2 is depicted in FIG. 8. That is, although the semiconductor chip 820_2 according to the example embodiment does not include the TSV and the upper pad, unlike the internal substrate 820_1, the semiconductor chip 820_2 may include the TSV and the upper pad and an additional semiconductor chip may further be stacked on the semiconductor chip 820_2.

The semiconductor chip 820_2 may be a memory device, a logic device, or any other semiconductor device. Meanwhile, both of the internal substrate 820_1 and the semiconductor chip 820_2 may be memory devices, logic devices, or any other semiconductor device. Additionally, the internal substrate 820_1 and the semiconductor chip 820_2 may be different types of semiconductor devices. For example, the internal substrate 820_1 may be a logic device and the semiconductor chip 820_2 may be a memory device.

The heat dissipating member 830 may dissipate heat and/or transfer heat which may be generated in an operation of the semiconductor package 800 to the outside of the semiconductor package 800.

It is illustrated that the molding member 840 according to the example embodiment is formed to cover an upper surface 820_2T of the semiconductor chip 820_2 so that the heat dissipating member 830 is formed only on an upper surface 840T of the molding member 840. However, it is not limited thereto.

For example, the molding member 840 may expose the upper surface 820_2T of the semiconductor chip 820_2, similarly to the molding member 140 described with reference to FIG. 1B. In this case, the heat dissipating member 830 may be formed on at least one of the upper surface 820_2T of the semiconductor chip 820_2 and the upper surface 840T of the molding member 840.

The heat dissipating member 830 may include a heat dissipating molding member 832 and one or more moisture absorption particles 834. The heat dissipating molding member 832 and the moisture absorption particles 834 may have substantially the same structure as the heat dissipating molding member 132 and the moisture absorption particles 134 described with reference to FIG. 1B, respectively, and thus, their descriptions will be omitted.

The molding member 840 may cover the internal substrate 820_1 and the semiconductor chip 820_2 on the substrate 110 and protect the internal substrate 820_1 and the semiconductor chip 820_2. The molding member 840 may be formed of, for example, a silicon-based material, a thermo-hardening material, a thermo-plastic material, a UV process material, etc.

Figure 9:
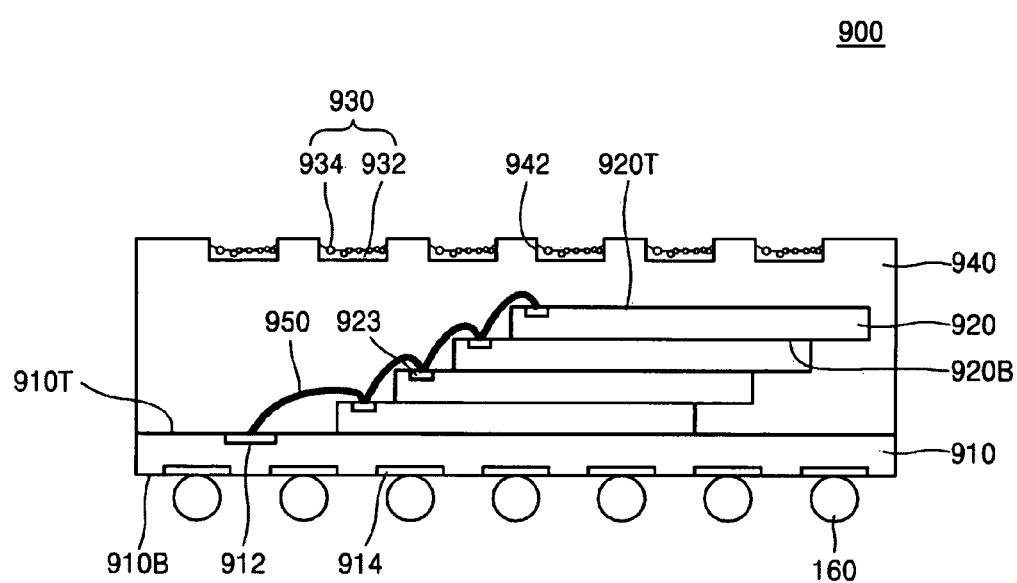
FIG. 9 is a cross-sectional view of a semiconductor package according to another example embodiment.

FIG. 9 is a cross-sectional view of a semiconductor package 900 according to another example embodiment. In FIG. 9, like reference numerals refer to like elements in FIGS. 1A through 6, and thus, repeated descriptions will be omitted for brevity of explanation.

Referring to FIG. 9, the semiconductor package 900 may include a substrate 910, semiconductor chips 920 stacked on the substrate 910, a molding member 940 formed to cover the semiconductor chips 920 on the substrate 910, the solder ball 160 coupled to a lower surface of the substrate 910, and a heat dissipating member 930 formed in a recess portion 942 of the molding member 940.

The semiconductor package 900 according to the example embodiment has substantially the same structure as the semiconductor package 600 described with reference to FIG. 6. However, the semiconductor package 900 differs from the semiconductor package 600 in that the plurality of semiconductor chips 920 are stacked on the substrate 910.

The substrate 910 may include a conductive pad 912 formed on an upper surface 910T of the substrate 910 and a solder ball pad 914 formed on a lower surface 910B of the substrate 910. The substrate 910 may be, for example, a printed circuit board, and the substrate 910 may have substantially the same structure as the substrate 110 described with reference to FIG. 1B, except a location in which the conductive pad 912 is formed.

Each of the semiconductor chips 920 may have an upper surface 920T and a lower surface 920B facing the upper surface 920T. A chip connection pad 923 may be disposed in a boundary portion of the upper surface 920T of each of the semiconductor chips 920.

The semiconductor chips 920 may be stacked as steps so that each chip connection pad 923 is exposed on the upper surface 910T of the substrate 910.

Although not shown, an adhesive member (not shown) may be formed on the lower surface 920B of each of the semiconductor chips 920. The adhesive member may be formed of, for example, any one of a non-conductive film (NCF), an anisotropic conductive film (ACF), a UV film, an instant adhesive, a thermo-hardening adhesive, a laser-hardening adhesive, an ultrasonic-hardening adhesive, a non-conductive paste (NCP), etc.

The semiconductor chips 920 that are stacked may be electrically connected to the substrate 910 via a connecting member 950.

In some example embodiments, the connecting member 950 may be a bonding wire as illustrated in FIG. 9. The bonding wire may be Au, Ag, Cu, Al, or an alloy thereof. However, it is not limited thereto. The connecting member 950 may be any of all connecting devices which may electrically connect the substrate 910 and the semiconductor chips 920. For example, the connecting member 950 may be formed of a solder ball, a bump, or a conductive via, such as a TSV, or a combination thereof.

In some example embodiments, all of the semiconductor chips 920 may be memory devices, logic devices, or other types of semiconductor devices. In other example embodiments, some of the semiconductor chips 920 may be memory devices, others may be logic devices, etc.

The heat dissipating member 930 may dissipate heat which may be generated in an operation of the semiconductor package 900 to the outside of the semiconductor package 900.

The heat dissipating member 930 may include a heat dissipating molding member 932 and moisture absorption particles 934. The heat dissipating molding member 932 and the moisture absorption particles 934 may have substantially the same structure as the heat dissipating molding member 132 and the moisture absorption particles 134 described with reference to FIG. 1B, respectively, and thus, their descriptions will be omitted.

The molding member 940 may cover the semiconductor chips 920 on the substrate 910, and may protect the semiconductor chips 920. The molding member 940 may be formed of, for example, a silicon-based material, a thermo-hardening material, a thermo-plastic material, a UV process material, etc.

FIGS. 10A through 10D are cross-sectional views for describing an order of processes for manufacturing the semiconductor package 100, according to an example embodiment.

In FIGS. 10A through 10D, like reference numerals refer to like elements in FIGS. 1A through 1C, and thus, repeated descriptions will be omitted for brevity of explanation.

Figure 10A:
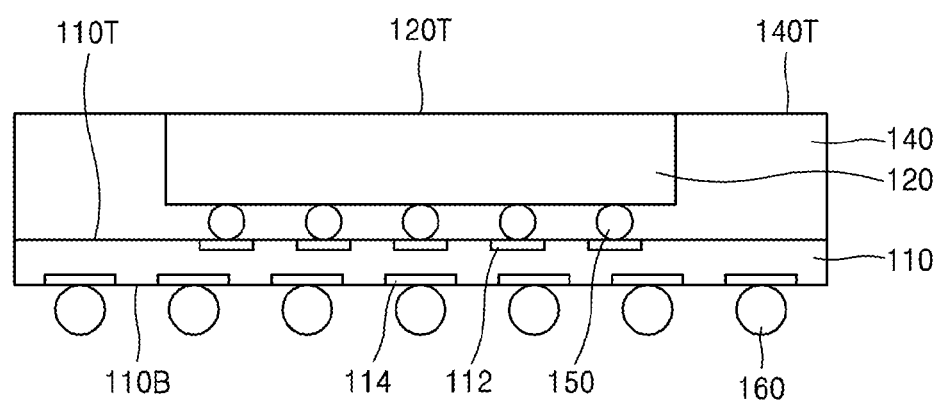
FIGS. 10A through 10D are cross-sectional views for describing an order of processes for manufacturing a semiconductor package, according to an example embodiment.

Referring to FIG. 10A, the substrate 110 on which the conductive pad 112 and the solder ball pad 114 are formed may be prepared, and the semiconductor chip 120 may be mounted on the upper surface 110T of the substrate 110. According to the example embodiment, the semiconductor chip 120 is mounted on the substrate 110 by a flip chip method, and the semiconductor chip 120 may be coupled to the substrate 110 by a thermo-compression method by using the bump 150 as a medium.

The molding member 140 may be formed by injecting an appropriate amount of a molding resin onto the upper surface 110T of the substrate 110 by using an injection element (for example, a nozzle) and pressurizing the substrate 110 or the semiconductor chip 120 by using a pressurizing element (not shown) such as a press. Here, the process condition, such as a delay time between the injection of the molding resin and the pressurization, the injected amount of the molding resin, and the pressurization temperature and the pressure, may be configured by considering physical properties, such as a viscosity of the molding resin. In some example embodiments, the molding resin may include an epoxy-based molding resin or a polyimide-based molding resin.

Meanwhile, the molding member 140 according to the example embodiment may be formed by using an MUF process, or other like processes. However, the molding member 140 may be formed by performing an additional process of under-filling a space between the semiconductor chip 120 and the substrate 110, unlike what is described with reference to FIG. 1B.

Also, according to the example embodiment, the upper surface 140T of the molding member 140 is located at the same height as the upper surface 120T of the semiconductor chip 120 so that the molding member 140 covers only the side wall 120S of the semiconductor chip 120 and exposes the upper surface 120T of the semiconductor chip 120. However, it is not limited thereto. For example, the molding member 540 may be formed to cover both of the upper surface 520T and the side wall 520S of the semiconductor chip 520, as illustrated in FIG. 5.

The solder ball 160 disposed on the lower surface 110B of the substrate 110 may be formed after the semiconductor chip 120 and the molding member 140 are formed on the upper surface 110T of the substrate 110, or before the semiconductor chip 120 and the molding member 140 are formed.

Figure 10B:
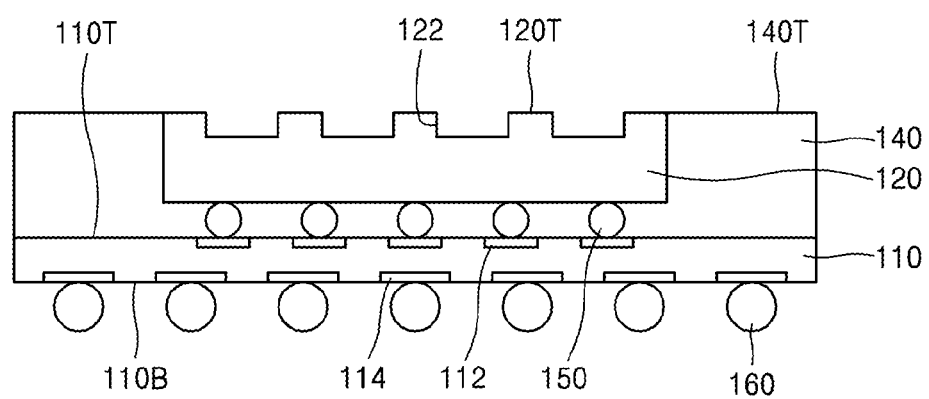

Referring to FIG. 10B, the recess portion 122 is formed in the upper surface 120T of the semiconductor chip 120.

The recess portion 120 may be formed by various patterning processes which use, for example, a doctor blade or a laser.

In some example embodiments, for the heat dissipating member 130 (refer to FIG. 10E) that is to be formed in the recess portion 122 to sufficiently absorb moisture outside the semiconductor package 100, the patterning processes may be controlled such that the recess portion 122 has a depth that is equal to or less than 100 μm.

Although the recess portion 122 according to the example embodiment is formed only in the upper surface 120T of the semiconductor chip 120, the recess portion 122 may be formed in the upper surface 140T of the molding member 140, similarly as the recess portions 422_1, 422_2, and 542 described in detail with reference to FIGS. 4 and 5.

Figure 10C:
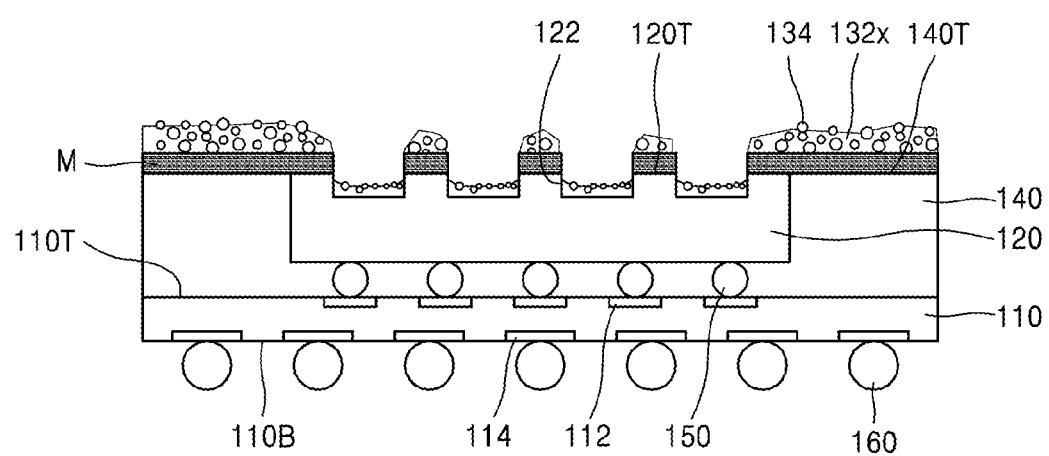

Referring to FIG. 10C, a mask pattern M which exposes the recess portion 122 may be formed in the upper surface 120T of the semiconductor chip 120 and in the upper surface 140T of the molding member 140.

After the mask pattern M is formed, a printing process may be performed to fill the recess portion 122 with a heat dissipating molding resin 132$x$ including the moisture absorption particles 134.

The heat dissipating molding resin 132$x$ may include, for example, an epoxy-group molding resin or a polyimide-group molding resin. Aspects with respect to the resins are described in detail with reference to FIGS. 1A through 1C, and thus, their descriptions will be omitted.

In some example embodiments, after the printing process, a curing process for hardening the heat dissipating molding resin 132$x$ formed in the recess portion 122 may be performed.

Figure 10D:
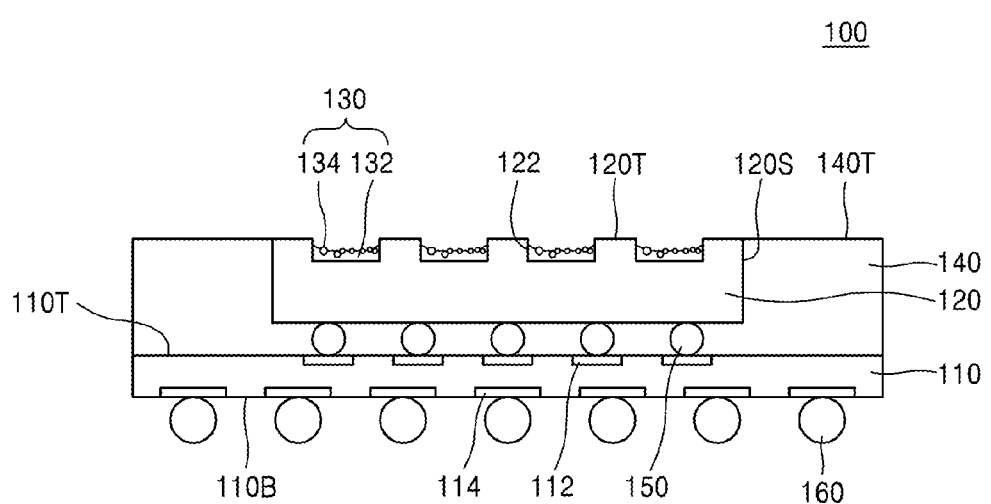

Referring to FIG. 10D, the heat dissipating member 130 including the heat dissipating molding member 132 and the moisture absorption particles 134 may be formed by removing the mask pattern M and the heat dissipating molding resin 132$x$ formed on the mask pattern M. Accordingly, the semiconductor package 100 including the heat dissipating member 130 may be manufactured.

Figure 11:
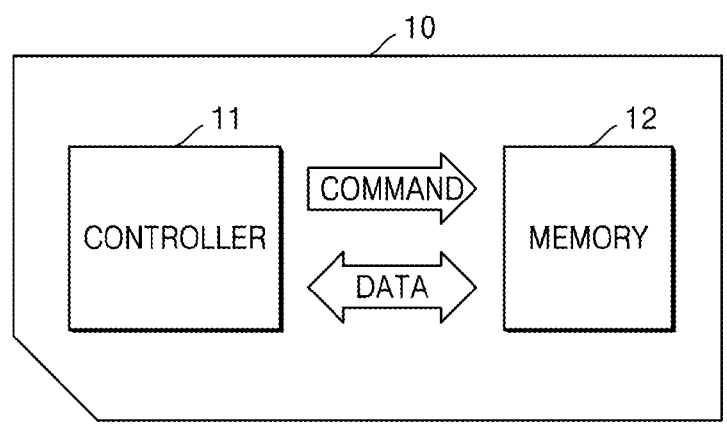
FIG. 11 is a block diagram of a memory card including a semiconductor package according to some example embodiments.

FIG. 11 is a block diagram of a memory card 10 including the semiconductor packages 100, 200, 300, 400, 500, 600, 700, 800, and 900.

Referring to FIG. 11, a controller 11 and a memory 12 may be disposed in the memory card 10 such that the controller 11 and the memory 12 may exchange electrical signals. For example, when the controller 11 gives commands, the memory 12 may transfer data. The controller 11 and/or the memory 12 may include any one of the semiconductor packages 100, 200, 300, 400, 500, 600, 700, 800, and 900. The memory 12 may include a memory array (not shown) or a memory array bank (not shown).

The memory card 10 may be used in various types of cards, for example, memory devices, such as a memory stick card, a smart media (SM) card, a secure digital (SD) card, a mini SD card, a multimedia card (MMC), etc.

Figure 12:
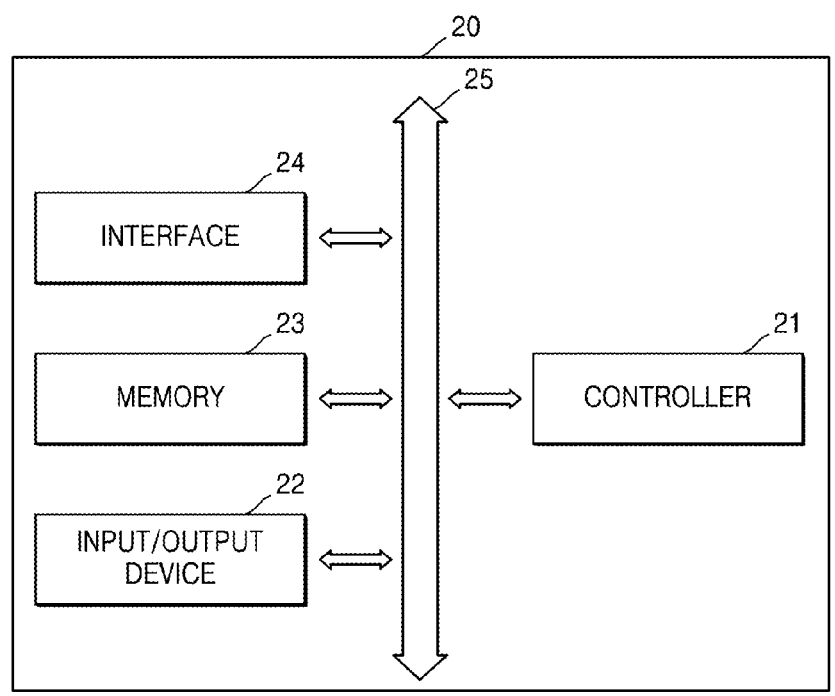
FIG. 12 is a block diagram of an electronic system including a semiconductor package according to some example embodiments.

FIG. 12 is a block diagram of an electronic system 20 including the semiconductor packages 100, 200, 300, 400, 500, 600, 700, 800, and 900.

Referring to FIG. 12, the electronic system 20 may include a controller 21, an input/output device 22, a memory 23, and an interface 24. The electronic system 20 may be a system which transmits or receives a mobile system or information.

The mobile system, for example, may be a personal digital assistant (PDA), a portable computer, a web tablet, a wireless phone, a mobile phone, a digital music player, a memory card, etc.

The controller 21 may execute programs and control the electronic system 20. The controller 21 may be, for example, a microprocessor, a digital signal processor, a microcontroller, or a similar device. The input/output device 22 may be used in inputting or outputting data of the electronic system 20.

The electronic system 20 may exchange data with external devices, for example, personal computers or networks, by using the input/output device 22, while connected to the external devices. The input/output device 22 may be, for example, a keypad, a keyboard, or a display. The memory 23 may store a code and/or data for an operation of the controller 21, and/or may store data processed by the controller 21. The controller 21 and the memory 23 may include any of the semiconductor packages 100, 200, 300, 400, 500, 600, 700, 800, and 900. The interface 24 may be a data transmitting path between the electronic system 20 and external devices. The controller 21, the input/output device 22, the memory 23, and the interface 24 may communicate with one another via a bus 25.

For example, the electronic system 20 may be used in mobile phones, MP3 players, navigations, portable multimedia players (PMPs), solid state disk (SSD), household appliances, etc.

Figure 13:
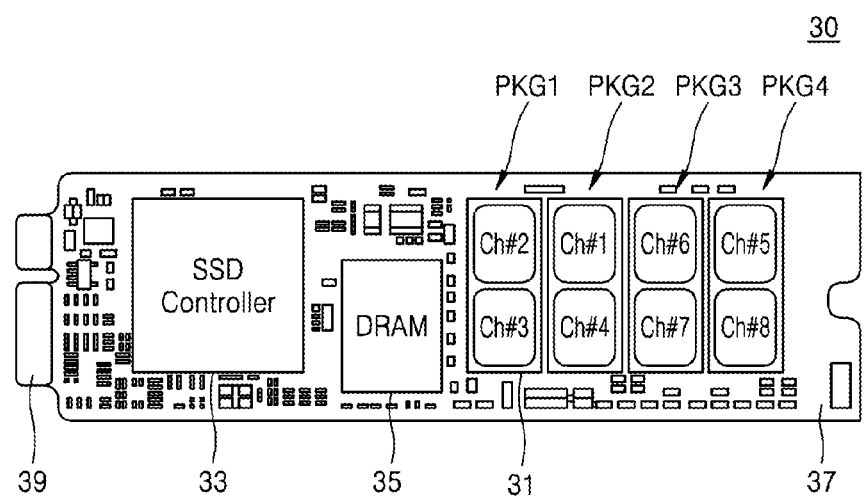
FIG. 13 is a cross-sectional view of a solid state disk (SSD) device to which a semiconductor package according to some example embodiments.

FIG. 13 is a cross-sectional view of an SSD device 30 to which the semiconductor packages 100, 200, 300, 400, 500, 600, 700, 800, and 900 are applied. FIG. 13 illustrates an example embodiment in which the electronic system 20 of FIG. 12 is applied to the SSD device 30.

Referring to FIG. 13, the SSD device 30 according to the example embodiment may include a memory package 31, an SSD controller 33, dynamic random access memory (DRAM) 35, and a main board 37.

The memory package 31, the SSD controller 33, and the DRAM 35 may include any of the semiconductor packages 100, 200, 300, 400, 500, 600, 700, 800, and 900. However, it is not limited thereto. Some example embodiments may also include an SSD device using a semiconductor package of another structure, which may adopt an internal sealing member and an external sealing member having a different modulus.

The memory package 31 may be mounted on the main board 37 by an external connecting member, and may include four memory packages PKG1, PKG2, PKG3, and PKG4, as illustrated in FIG. 13. However, it is not limited thereto, and more memory packages 31 may be mounted on the main board 37, according to a channel support condition of the SSD controller 33. Meanwhile, when the memory package 31 is formed of multi-channels, the number of memory packages 31 may be less than four.

The memory package 31 may be mounted on the main board 37 via the external connecting member, such as a solder ball, by using a ball grid array (BGA) method. However, it is not limited thereto and the memory package 31 may also be mounted on the main board 37 by using other methods. For example, the memory package 31 may be mounted on the main board 37 by using a pin grid array (PGA) method, a tape carrier package (TCP) method, a chip-on-board (COB) method, a quad flat non-leaded (QFN) method, and a quad flat package (QFP) method.

The SSD controller 33 may include eight channels, and the eight channels have one-on-one connections with corresponding channels of the four memory packages PKG1, PKG2, PKG3, and PKG4, in order to control semiconductor chips in the memory package 31.

The SSD controller 33 may include a program which may exchange signals with external devices by using a method according to the serial advanced technology attachment (SATA) standard, the parallel advanced technology attachment (PATA) standard, or the small computer system interface (SCSI) standard. Here, the SATA standard may include all SATA standards including SATA-2, SATA-3, and external SATA, in addition to the SATA-1. The PATA standard may include all IDE standards including the integrated drive electronics (IDE) standard, the enhanced IDE.

Also, the SSD controller 33 may operate the EEC or the FTL process. The SSD controller 33 may be mounted on the main board 37 as a package. The SSD controller 33 may be mounted on the main board 37 by a BGA method, a PGA method, a TCP method, a COB method, a QFN method, or a QFP method, like the memory package 31.

The DRAM 35 is an auxiliary memory device and may perform as a buffer in a data exchange between the SSD controller 33 and the memory package 31. The DRAM 35 may also be mounted on the main board 37 by using various methods including the BGA method, the PGA method, the TCP method, the COB method, the QFN method, and the QFP method.

The main board 37 may be a PCB, a flexible PCB, an organic substrate, a ceramic substrate, and a tape substrate. The main board 37 may include, for example, a core board (not shown) having an upper surface and a lower surface, and a resin layer (not shown) formed on each of the upper surface and the lower surface. Also, the resin layers may be formed as a multi-layer structure, in which a signal layer, a ground layer, or a power layer forming wiring patterns is interposed. Meanwhile, additional wiring patterns may be formed on the resin layers. In FIG. 13, minute patterns on the main board 37 may refer to wiring patterns or a plurality of manual devices. Meanwhile, an interface 39 for communicating with an external device may be formed on a side, for example, a left side of the main board 37.

Figure 14:
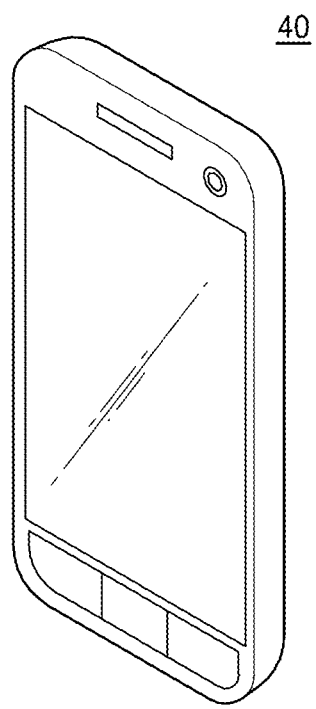
FIG. 14 is a cross-sectional view of an electronic device to which a semiconductor package according to some example embodiments.

FIG. 14 is a cross-sectional view of an electronic device to which the semiconductor packages 100, 200, 300, 400, 500, 600, 700, 800, and 900 are applied.

FIG. 14 illustrates an example in which the electronic system 20 of FIG. 13 is applied to a mobile phone 40. In addition, the electronic system 20 may be applied to portable notebooks, MP3 players, navigation, SSD, automobiles, or household appliances.

The units and/or modules described herein may be implemented using hardware components, software components, or a combination thereof. For example, the hardware components may include microcontrollers, memory modules, sensors, amplifiers, band-pass filters, analog to digital converters, and processing devices, or the like. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, or computer storage medium or device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of some example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor package comprising:
    a substrate having an upper surface and a lower surface;
    a semiconductor chip mounted on the upper surface of the substrate, the semiconductor chip including an upper surface, and the upper surface including a first recess portion;
    a molding member that exposes the upper surface of the semiconductor chip and is disposed between the semiconductor chip and the upper surface of the substrate; and
    a first heat dissipating member formed in the first recess portion, wherein the first heat dissipating member comprises at least one moisture absorption particle and a heat dissipation molding member.

2. The semiconductor package of claim 1, wherein the upper surface of the semiconductor chip comprises a protrusion portion defined by the first recess portion, and the protrusion portion has a matrix structure.

3. The semiconductor package of claim 1, wherein the first recess portion has a depth that is equal to or less than 100 μm.

4. The semiconductor package of claim 1, further comprising:
    a second recess portion provided on an upper surface of the molding member; and
    a second heat dissipating member formed in the second recess portion.

5. The semiconductor package of claim 1, wherein the moisture absorption particle absorbs moisture around the semiconductor package at room temperature.

6. The semiconductor package of claim 1, wherein the moisture absorption particles is formed from at least one of sodium polyacrylate, polyacrylic alcohol-based copolymer, polyacryl amide, potassium polyacrylate, polyacrylic acid, silica gel, molecular sieve, montmorillonite clay, and zeolite.

7. The semiconductor package of claim 1, wherein the heat dissipating molding member is formed from an epoxy-group molding resin or a polyimide-group molding resin.

8. The semiconductor package of claim 1, further comprising:
    a bump interposed between the semiconductor chip and the substrate; and
    the semiconductor chip is mounted on the substrate by using the bump as a medium.

9. The semiconductor package of claim 8, further comprising an under-fill covering the bump between the semiconductor chip and the substrate.

10. The semiconductor package of claim 1, wherein the substrate has an opening slit formed in a central portion thereof, and the semiconductor chip is mounted on the substrate in a face-down manner.

11. The semiconductor package of claim 1, wherein an upper surface of the heat dissipating member is lower than the upper surface of the semiconductor chip.

12. The semiconductor package of claim 1, wherein an upper surface of the heat dissipating member is located at the same height as the upper surface of the semiconductor chip.

13. The semiconductor package of claim 1, wherein an upper surface of the heat dissipating member is higher than the upper surface of the semiconductor chip.

14. A semiconductor package comprising:
    a substrate having an upper surface and a lower surface;
    a semiconductor chip mounted on the upper surface of the substrate;
    a molding member which is formed such that the molding member covers an upper surface and a side surface of the semiconductor chip on the upper surface of the substrate, and in an upper surface of which a recess portion is formed; and
    a heat dissipating member formed in the recess portion, wherein the heat dissipating member comprises a plurality of moisture absorption particles and a heat dissipation molding member.

15. The semiconductor package of claim 14, wherein a lower surface of the recess portion is higher than the upper surface of the semiconductor chip.

16. A semiconductor package comprising:
    a substrate;

at least one semiconductor device, the at least one semiconductor device mounted on the upper surface of the substrate;

a molding member, the molding member including at least one heat dissipating member, formed such that the molding member covers an upper surface and a side surface of the semiconductor chip on the upper surface of the substrate, and in an upper surface of which a recess portion is formed, the at least one heat dissipating member formed in the recess portion and the heat dissipating member including a plurality of moisture absorption particles and a heat dissipation molding member; and wherein the at least one semiconductor device includes a plurality of semiconductor devices arranged in a stacked manner.

17. The semiconductor package of claim 16, wherein the semiconductor device includes at least one heat dissipating member disposed on an upper surface of the semiconductor device.

18. The semiconductor package of claim 16, wherein the molding member covers the exposed surfaces of the plurality of semiconductor devices.

19. The semiconductor package of claim 16, wherein the moisture absorption particles are formed from a moisture absorption substance.

20. The semiconductor package of claim 16, wherein the molding member defines the exposed surface of the semiconductor device.

* * * * *